United States Patent [19]

Ito et al.

[11] Patent Number: 5,140,186
[45] Date of Patent: Aug. 18, 1992

[54] VOLTAGE COMPARATOR

[75] Inventors: Masao Ito; Shiro Hosotani, both of Itami, Japan

[73] Assignee: Mitsubishi Denki Kabushiki Kaisha, Tokyo, Japan

[21] Appl. No.: 631,649

[22] Filed: Dec. 21, 1990

[30] Foreign Application Priority Data

Dec. 26, 1989 [JP] Japan ................... 1-341429

[51] Int. Cl.⁵ .................. H03K 5/153; H03K 5/24
[52] U.S. Cl. .......................... 307/350; 307/355
[58] Field of Search .............. 307/350, 355, 231

[56] References Cited

U.S. PATENT DOCUMENTS

| | | | |
|---|---|---|---|
| 4,560,890 | 12/1985 | Masuda et al. | 307/355 |
| 4,695,748 | 9/1987 | Kumamoto | 307/355 |
| 4,760,287 | 7/1988 | Goto et al. | 307/355 |
| 4,908,624 | 3/1990 | Goto et al. | 307/355 |
| 5,010,338 | 4/1991 | Miki et al. | 307/355 |

FOREIGN PATENT DOCUMENTS

| | | | |
|---|---|---|---|
| 55-135418 | 10/1980 | Japan | 307/355 |
| 60-64520 | 4/1985 | Japan | 307/355 |
| 60-211371 | 10/1985 | Japan | 307/350 |
| 63-36157 | 2/1988 | Japan | 307/355 |
| 2181315 | 4/1987 | United Kingdom . | |

Primary Examiner—Eugene R. LaRoche
Assistant Examiner—Tan Dinh
Attorney, Agent, or Firm—Morrison Law Firm

[57] ABSTRACT

A voltage comparator includes a coupling capacitor which receives at one terminal thereof two signals applied in a complementary fashion, an inverting amplifier having an input coupled to the other terminal of the coupling capacitor and having an output, and switch means coupled between the input and output of the inverting amplifier so as to be in parallel with the inverting amplifier. The duration of an auto-zeroing interval during which the switch means is conductive is maintained constant regardless of the period of the ON-OFF operation of the switch means.

3 Claims, 3 Drawing Sheets

VOLTAGE COMPARATOR

This invention relates to a voltage comparator in which the duration of an "auto-zeroing" interval is maintained constant regardless of the frequency of an operating clock signal.

BACKGROUND OF THE INVENTION

FIG. 1 is a circuit diagram showing a conventional voltage comparator in which the operation is controlled by conventional switching control clock signals such as those shown in FIG. 2. In FIG. 1, a first terminal 1 to which a voltage V, is applied is coupled through a switch S1 to one terminal 3 of a coupling capacitor 10. A second terminal 2, to which a voltage $V_2$ is applied, is coupled through a switch S2 also to the terminal 3 of the coupling capacitor 10. The other terminal 4 of the coupling capacitor 10 is connected to an input terminal 7 of a first inverting amplifier 11 which may comprise, for example, a CMOS device. Another switch S3 is connected between the input terminal 7 and an output terminal 5 of the inverting amplifier 11 so as to be in parallel with the inverting amplifier 11. The output terminal 5 of the first inverting amplifier 11 is connected to an input terminal 8 of a second inverting amplifier 12 which may comprise, for example, a CMOS device. An output terminal 9 of the second inverting amplifier 12 is connected to an output terminal 6 of the voltage comparator, at which an output voltage $V_3$ is developed.

In the conventional voltage comparator shown in FIG. 1, the switches S1 and S3 are ON-OFF controlled by a switch controlling clock signal $\phi$ shown in FIG. 2, and the switch S2 is ON-OFF controlled by a switching controlling clock signal $\bar{\phi}$ which is in opposite phase with the clock signal $\phi$. In FIG. 2, the switch controlling clock signals $\phi$ and $\bar{\phi}$ are produced from a basic clock signal $\phi_{EXT}$. An interval $T_1$ is a so-called "auto-zeroing" interval during which the input and output of the inverting amplifier 11 are coupled to each other to short-circuit the inverting amplifier 11 to thereby place the voltages at the input and output of the inverting amplifier 11 to a constant reference voltage which is discussed later. An interval $T_2$ is a comparison interval during which the voltage $V_1$ applied during the auto-zeroing interval and the voltage $V_2$ applied during the interval $T_2$ following the auto-zeroing interval $T_1$ are compared with each other.

Next, the operation of the conventional voltage comparator of FIG. 1 is explained with reference to FIGS. 2 and 3. During an interval or auto-zeroing interval $T_1$ during which the clock signal $\phi$ assumes a logic "1" value and the clock signal $\bar{\phi}$ assumes a logic "0" value, the switches S1 and S3 are turned on as indicated by broken lines, while the switch S2 is turned off indicated also by a broken line. With the switch S1 turned on, the voltage $V_1$ is applied to the terminal 3 of the coupling capacitor 10. With the switch S3 turned on, the input and output terminals 7 and 5 of the first CMOS inverting amplifier 11 are connected to each other, so that the voltages at the input and output terminals of the first CMOS inverting amplifier 11 assumes a constant voltage $V_0$ which corresponds to the voltage at the intersection of a straight line L representing the relationship of "Input Voltage=Output Voltage" with a curve IN representing the transfer characteristic of the first CMOS inverting amplifier 11, shown in FIG. 3. As a result, a difference voltage $V_1 - V_0$ is applied across the coupling capacitor 10, so that charge $Q_1$ expressed by the following equation (1) is stored on the coupling capacitor 10.

$$Q_1 = C(V_1 - V_0) \tag{1}$$

where C is a capacitance value of the capacitor 10.

During an interval when the clock signal $\phi$ is at the logic "0" and the clock signal $\bar{\phi}$ is at the logic "1", i.e. during the comparison interval $T_2$, the switches S1 and S3 are turned off as indicated by solid lines in FIG. 1, whereas the switch S2 is turned on as indicated by a solid line. With the switch S2 turned on, the voltage $V_2$ is coupled to the terminal 3 of the coupling capacitor 10. Assuming that the application of the voltage $V_2$ to the terminal 3 of the coupling capacitor 10 causes the input voltage to the first CMOS inverting amplifier 11 to change to $V_A$, a difference voltage of $V_2 - V_A$ is applied across the coupling capacitor 10, so that charge $Q_2$ expressed by the following equation (2) is stored on the coupling capacitor 10.

$$Q_2 = C(V_2 - V_A) \tag{2}$$

During the comparison interval $T_2$, the coupling capacitor 10 is neither charged nor discharged, and, therefore, the charge $Q_2$ is equal to the charge $Q_1$ which was stored during the auto-zeroing interval $T_1$. Thus, the following relationship is established.

$$C(V_1 - V_0) = C(V_2 - V_A)$$

From this, the following equation (3) is derived.

$$V_A - V_0 = V_2 - V_1 \tag{3}$$

The equation (3) indicates that a change in voltage from $V_1$ to $V_2$ at the terminal 3 of the coupling capacitor 10 causes the potential at the input terminal 7 of the first CMOS inverting amplifier 11 to change from $V_0$ to $V_A$. An offset $V_A - V_0$ produced due to the change of the input voltage to the CMOS inverting amplifier 11 from $V_0$ to $V_A$ is amplified in accordance with the transfer characteristic IN of the CMOS inverting amplifier 11, and an output voltage $V_{OUT}$ is developed at the output terminal 5 in accordance with the result of the comparison of the voltages $V_1$ and $V_2$ applied to the terminal 3 of the coupling capacitor 10.

The output voltage $V_{OUT}$ is inverted and amplified by the second CMOS inverting amplifier 12 and is developed as an output voltage $V_3$ at the output terminal 6 of the voltage comparator. To sum up, the voltage comparator shown in FIG. 1 operates to compare the input voltage $V_1$ applied through the input terminal 1 and the switch S1 during the auto-zeroing interval $T_1$ with the input voltage $V_2$ applied through the input terminal 2 and the switch S2 during the comparison interval $T_2$, and develops at its output terminal 6 a logic "1" or "0" depending on the relationship in magnitude between the input voltages $V_1$ and $V_2$.

In the conventional voltage comparator shown in FIG. 1, the width of each of the clock signals $\phi$ and $\bar{\phi}$ for controlling the switches S1, S2, and S3 is proportional to the period of the basic clock signal $\phi_{EXT}$ which is supplied from an external circuit. Accordingly, as the frequency of the basic clock signal $\phi_{EXT}$ decreases, the duration of the auto-zeroing interval $T_1$ becomes longer.

During the auto-zeroing interval $T_1$, the switch S3 is turned on and, accordingly, the input and output voltages to and from the CMOS inverting amplifier 11 are equal to each other and equal to $V_0$. When the input voltage to the first CMOS inverting amplifier 11 is between the threshold voltage $V_{THP}$ of a P-channel MOS (hereinafter referred to as PMOS) transistor and the threshold voltage $V_{THN}$ of an N-channel MOS (hereinafter referred to as NMOS) transistor of the inverting amplifier 11, and, therefore, the inverting amplifier 11 operates within a range indicated by hatching, as shown in FIG. 4, the PMOS and NMOS transistors of the inverting amplifier 11 are concurrently conductive. In particular, when the input voltage is in the vicinity of the voltage $V_0$, both transistors operate in their saturation regions $R_{SN}$ and $R_{SP}$, which causes large power to be consumed. In FIG. 4, $R_{SN}$ represents the saturation region of the NMOS transistor, and $R_{UN}$ represents the unsaturation region of the NMOS transistor. $R_{SP}$ and $R_{UP}$ represent the saturation and unsaturation regions of the PMOS transistor, respectively.

This voltage comparator has a disadvantage that as the auto-zeroing interval $T_1$ increases, power consumption increases.

An object of the present invention is to provide a voltage comparator which is free of the above-stated disadvantage of the conventional voltage comparator, in which, regardless of the frequency of the basic clock signal, the duration of the auto-zeroing interval is maintained constant so that the power consumption of the voltage comparator can be minimized.

SUMMARY OF THE INVENTION

A voltage comparator according to the present invention includes a coupling capacitor having one terminal to which signals are applied, an inverting amplifier having its input terminal connected to the other terminal of the coupling capacitor, and switch means connected between the input and output of the inverting amplifier so as to be in parallel with the inverting amplifier. The conduction period of the switch means is maintained constant regardless of the frequency of a basic clock signal.

DETAILED DESCRIPTION OF THE INVENTION

Now, the present invention is described in detail by means of one embodiment.

Figure 5:
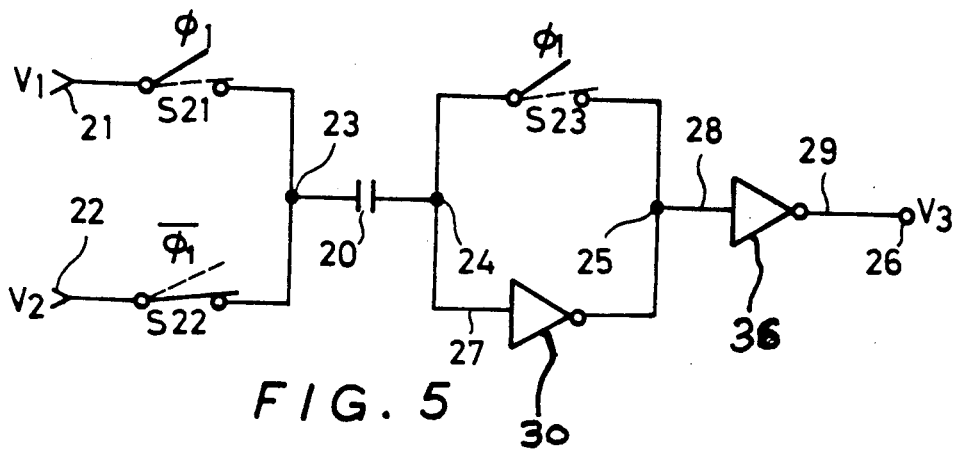
FIG. 5 is a circuit diagram of a voltage comparator according to one embodiment of the present invention which uses clock signals shown in FIG. 6 as switch controlling clock signals.

FIG. 5 is a circuit diagram of a voltage comparator according to the present invention. Basically, the operation of the voltage comparator shown in FIG. 5 is the same as that of the conventional voltage amplifier shown in FIG. 1. In FIG. 5, a first input terminal 21 which receives a voltage $V_1$ to be compared is connected through a switch S21 to one terminal 23 of a coupling capacitor 20. A second input terminal 22 which receives a voltage $V_2$ with which the voltage $V_1$ is to be compared is connected through a switch S22 to the terminal 23 of the coupling capacitor 20. The other terminal 24 of the coupling capacitor 20 is coupled to an input terminal 27 of a first inverting amplifier 30 which comprises, for example, a CMOS device. The inverting amplifier 30 has an output terminal 25. Between the input terminal 27 and output terminal 25 of the inverting amplifier 30, a switch S23 is connected in parallel with the amplifier 30. The output terminal 25 of the first inverting amplifier 30 is connected to an input terminal 28 of a second inverting amplifier 36 which comprises, for example, a CMOS device. The second inverting amplifier 36 has its output terminal 29 connected to an output terminal 26 of the voltage comparator. An output voltage $V_3$ is developed at the output terminal 26.

Figure 6:
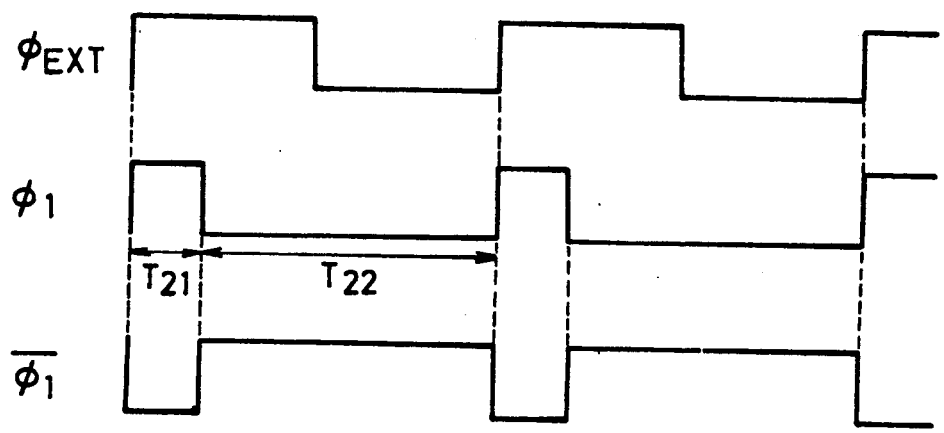
FIG. 6 shows timing relation of clock signals used as switch controlling clock signals for the voltage comparator of the present invention shown in FIG. 5.

In the voltage comparator according to the present invention shown in FIG. 5, the turning on and turning off of the switches S21 and S23 are controlled by means of a switch controlling clock signal $\overline{\phi}_1$ shown in FIG. 6, and the turning on and off of the switch S22 are controlled by means of a switch controlling clock signal $\phi_1$ which is in opposite phase with the clock signal $\overline{\phi}_1$. The switch controlling clock signals $\phi_1$ and $\overline{\phi}_1$ are produced from a basic clock signal $\phi_{EXT}$. In FIG. 6, $T_{21}$ is an auto-zeroing interval, and $T_{22}$ is a voltage comparison interval.

Figure 1:
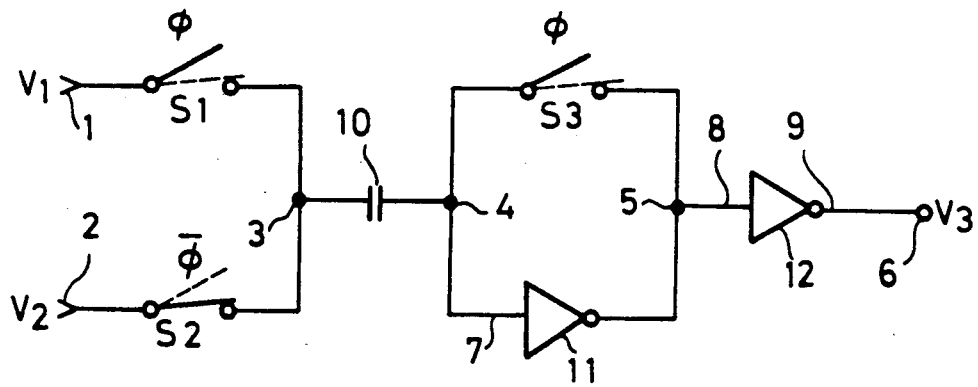
FIG. 1 is a circuit diagram of a conventional voltage comparator which uses conventional clock signals as switch controlling signals.
Figure 2:
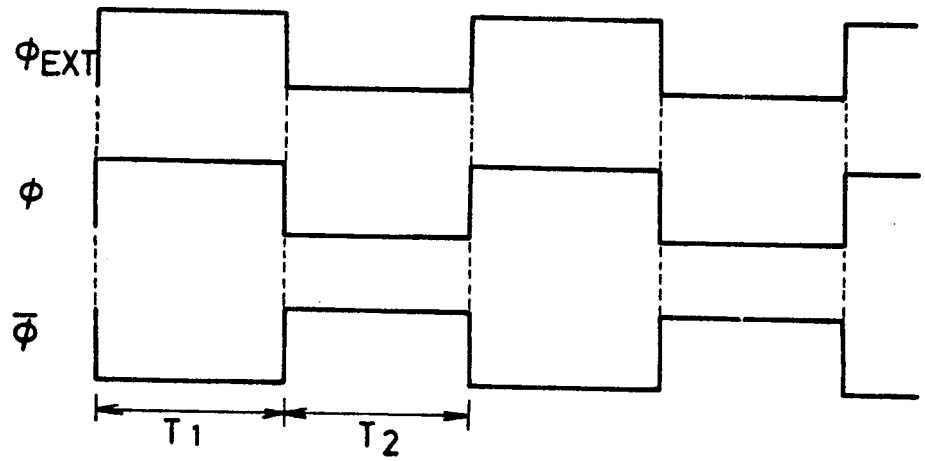
FIG. 2 shows timing relation of clock signals used in the voltage comparator shown in FIG. 1 as switch controlling signals.
Figure 3:
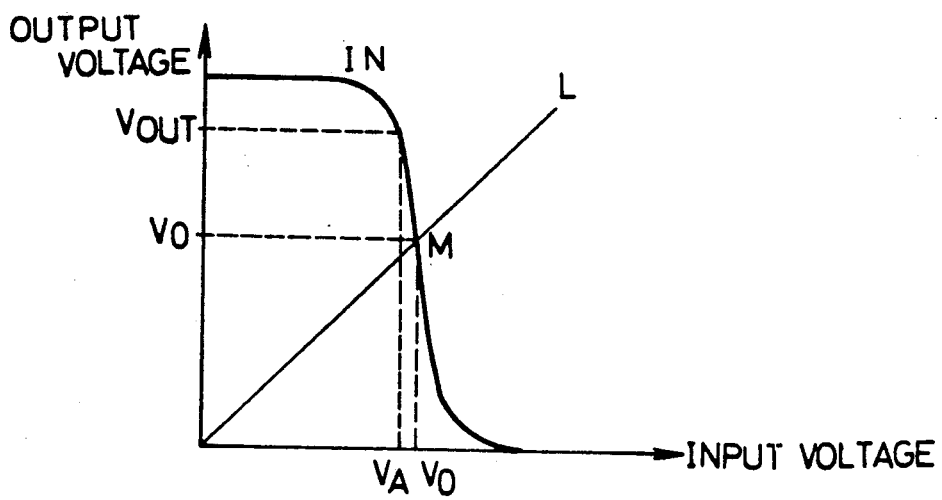
FIG. 3 shows an input voltage-output voltage characteristic of an inverting amplifier employed in the inverting amplifier of FIG. 1.
Figure 4:
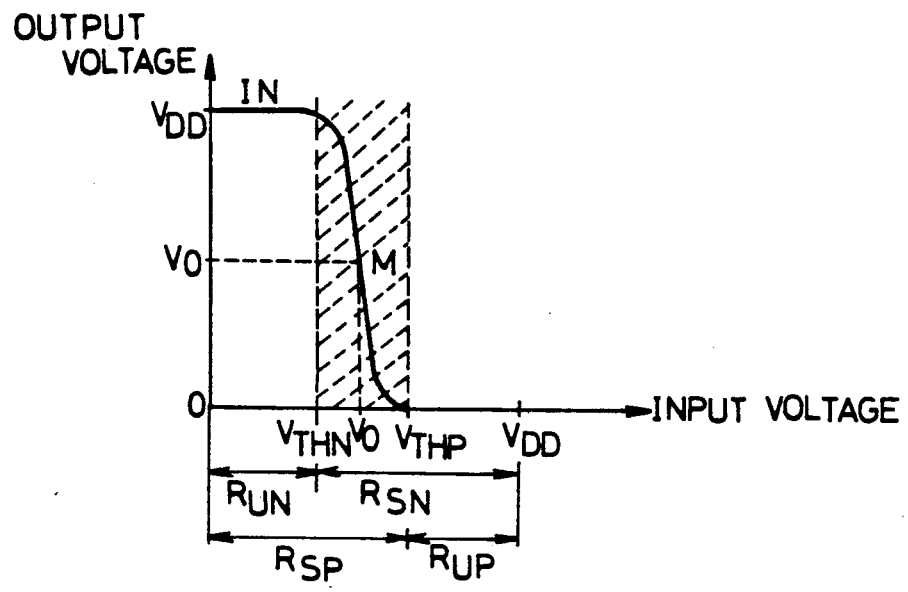
FIG. 4 illustrates a region in which both transistors of a CMOS circuit constituting the inverting amplifier used in the voltage comparator of FIG. 1 are concurrently conductive.

Basically, the arrangement and operation of the voltage comparator of the present invention shown in FIG. 5 are similar to those of the conventional voltage comparator shown in FIG. 1, except that the switches S21, S22, and S23 are turned on and off with a timing different from that of the switches S1, S2, and S3 of the FIG. 1 voltage comparator.

Specifically speaking, during the auto-zeroing interval $T_{21}$, the switches S21 and S23 are turned on and the switch S22 is turned off, as indicated by broken lines in FIG. 5, so that charge $Q_1 = C(V_1 - V_0)$ is stored on the coupling capacitor 20. (C is a capacitance value of the coupling capacitor 20.) During the comparison interval $T_{22}$, the switches S21 and S23 are turned off and the switch S22 is turned on, as indicated by solid lines, so that charge $Q_2 = C(V_2 - V_A)$ is stored on the coupling capacitor 20.

Thus, an output voltage $V_{OUT}$ corresponding to the result of comparison of the input voltages $V_1$ and $V_2$ is developed at the output terminal 25 of the first CMOS inverting amplifier 30. The output voltage $V_{OUT}$ is inverted and amplified by the second CMOS inverting amplifier 36, and it is developed at the output terminal 26 as an output voltage $V_3$ of the voltage comparator. Similar to the conventional voltage comparator, the output voltage $V_3$ exhibits a logic "1" or "0", depending on the relationship in magnitude between the input voltages $V_1$ and $V_2$.

Figure 7:
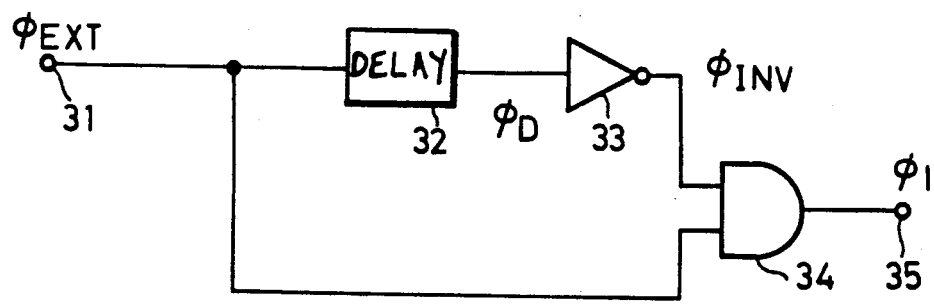
FIG. 7 is one example of a circuit which may be used to generate the clock signals shown in FIG. 6.

FIG. 7 is an example of a circuit which can be used to produce, from the externally supplied basic clock signal $\phi_{EXT}$ the clock signals $\phi_1$ and $\overline{\phi_1}$ which are used as the switch controlling signals in the voltage comparator of the present invention. The circuit of FIG. 7 can provide an auto-zeroing interval $T_{21}$ which has a constant time width regardless of the frequency of the basic clock signal $\phi_{EXT}$.

Figure 8:
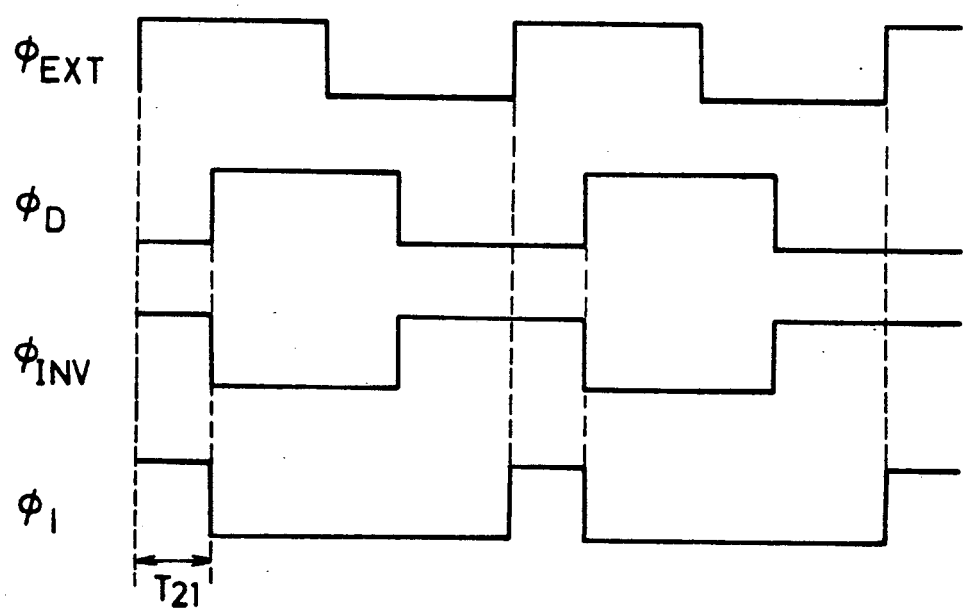
FIG. 8 shows timing relation of waveforms at various portions of the circuit shown in FIG. 7 for use in explaining the operation of the logic circuit of FIG. 7.

Now, the operation of the circuit of FIG. 7 is described with reference to FIG. 8. The basic clock signal $\phi_{EXT}$ applied at an input terminal 31 is coupled to a delay circuit 32 which provides a time delay equal to $T_{21}$ to a signal applied thereto. The clock signal $\phi_{EXT}$ is also coupled to one input of an AND circuit 34. At the output of the delay circuit 32, a clock signal $\phi_D$ delayed by $T_{21}$ from the clock signal $\phi_{EXT}$ is developed (see FIG. 8). The clock signal $\phi_D$ is inverted by an inverter circuit 33 to develop an inverted clock signal $\phi_{INV}$ which is applied to the other input of the AND circuit 34. Thus, at an output terminal 35 of the AND circuit 34, the switch controlling clock signal $\phi_1$ which is the logical product of the basic clock signal $\phi_{EXT}$ and the inverted clock signal $\phi_{INV}$ is developed. The switching control clock signal $\overline{\phi_1}$ is produced by inverting the clock signal $\phi_1$. The auto-zeroing interval of the switch controlling clock signals $\phi_1$ and $\overline{\phi_1}$ is determined by the delay time $T_{21}$ imparted by the delay circuit 32, and is maintained constant even when the frequency of the externally supplied basic clock signal $\phi_{EXT}$ decreases.

As described above, regardless of the frequency of the externally supplied basic clock signal $\phi_{EXT}$, and, in particular, regardless of decrease in the frequency of the basic clock signal $\phi_{EXT}$, the voltage comparator of the present invention can operate with an auto-zeroing interval having a duration which remains constant, and, accordingly, power consumed in the inverting amplifier 21 during the auto-zeroing interval also remains constant. Thus, the voltage comparator of the present invention has a low power consumption. Furthermore, since it is feasible to set the duration of the auto-zeroing interval to a desired value, it is possible to use a higher frequency basic clock signal by setting the auto-zeroing interval as short as possible, whereby the operation speed of the voltage comparator can be increased.

What is claimed is:

1. A voltage comparator comprising:
    an inverting amplifier;
    first and second signal input terminals;
    a first switch in series with said first signal input terminal;
    a second switch in series with said second signal input terminal;
    a capacitor;
    said first and second switches being connected to a first terminal of said capacitor;
    a second terminal of said capacitor being connected to an input of said inverting amplifier;
    a third switch connected between said input of said inverting amplifier and an output of said inverting amplifier;
    control means, responsive to an external signal, for simultaneous on and off control of said first and third switches;
    said control means being further effective for on and off control of said second switch complementary to on and off control of said first and third switches; and
    said control means including means for controlling an on condition of said first and third switches, and an off condition of said second switch, in an auto-zeroing interval, that remains substantially constant in time regardless of the frequency of said external signal.

2. Apparatus according to claim 1, wherein said inverting amplifier is a CMOS circuit.

3. Apparatus according to claim 1 wherein said control means includes:
    an AND circuit;
    said external signal being connected to one input of said AND gate;
    an inverter;
    an output of said inverter being connected to a second input of said AND circuit;
    a delay circuit receiving said external signal;
    an output of said delay being connected to said inverter; and
    an output of said AND circuit controlling said first and third switches for a time substantially equal to a delay of said delay circuit.

* * * * *